United States Patent
Jeon et al.

(10) Patent No.: US 9,761,823 B2
(45) Date of Patent: Sep. 12, 2017

(54) ORGANIC LIGHT EMITTING DISPLAY DEVICE

(71) Applicant: LG DISPLAY CO., LTD., Seoul (KR)

(72) Inventors: Seongsu Jeon, Gwangmyeong-si (KR); Jeonghaeng Heo, Paju-si (KR); Seung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/879,900

(22) Filed: Oct. 9, 2015

(65) Prior Publication Data
US 2016/0104854 A1    Apr. 14, 2016

(30) Foreign Application Priority Data

Oct. 13, 2014  (KR) .................. 10-2014-0137951
Jun. 29, 2015  (KR) .................. 10-2015-0092499

(51) Int. Cl.
*H01L 51/50* (2006.01)
*H01L 51/00* (2006.01)

(52) U.S. Cl.
CPC ........ *H01L 51/508* (2013.01); *H01L 51/5016* (2013.01); *H01L 51/5072* (2013.01); *H01L 51/5076* (2013.01); *H01L 51/5096* (2013.01); *H01L 51/007* (2013.01);
(Continued)

(58) Field of Classification Search
CPC .............. H01L 51/508; H01L 51/5076; H01L 51/5072; H01L 51/5016; H01L 51/5096; H01L 51/5008; H01L 51/5004; H01L 51/0072; H01L 2251/558; H01L 51/007
See application file for complete search history.

(56) References Cited

U.S. PATENT DOCUMENTS

| | | |
|---|---|---|
| 2002/0113546 A1 | 8/2002 | Seo et al. |
| 2013/0105777 A1 | 5/2013 | Adamovich et al. |
| 2014/0103306 A1 | 4/2014 | Moon et al. |

FOREIGN PATENT DOCUMENTS

| | | |
|---|---|---|
| CN | 1372434 A | 10/2002 |
| CN | 1905236 A | 1/2007 |
| CN | 103730582 A | 4/2014 |

(Continued)

OTHER PUBLICATIONS

Barth et al., "Electron mobility in tris(8-hydroxy-quinoline) aluminum thin films determined via transient electroluminescence from single- and multilayer organic light-emitting diodes," Journal of Applied Physics, vol. 89, No. 7, Apr. 1, 2001, pp. 3711-3719.

*Primary Examiner* — Kyoung Lee
(74) *Attorney, Agent, or Firm* — Birch, Stewart, Kolasch & Birch, LLP

(57) ABSTRACT

An organic light emitting display device is discussed. The organic light emitting display device in one embodiment includes at least one light emitting layer between an anode and a cathode, and an electron transport layer between the at least one light emitting layer and the cathode. The electron transport layer may include a first electron transport material for blocking holes from the light emitting layer to the electron transport layer, and a second electron transport material for assisting in a transfer of electrons to the light emitting layer, wherein the first electron transport material and the second electron transport material have different triplet exciton energy levels and different electron mobilities.

22 Claims, 12 Drawing Sheets

(52) U.S. Cl.
CPC ...... *H01L 51/0072* (2013.01); *H01L 51/5004* (2013.01); *H01L 51/5008* (2013.01); *H01L 2251/558* (2013.01)

(56) References Cited

FOREIGN PATENT DOCUMENTS

EP          1748504   A2       1/2007
KR       EP 1748504  A2   *   1/2007   ......... H01L 51/5096

* cited by examiner

ORGANIC LIGHT EMITTING DISPLAY DEVICE

This application claims the priority benefit of Korean Patent Application Nos. 10-2014-0137951 filed on Oct. 13, 2014 and 10-2015-0092499 filed on Jun. 29, 2015, which are all incorporated herein by reference for all purposes as if fully set forth herein.

BACKGROUND

Field of the Invention

The present invention relates to an organic light emitting display device, and more particularly, to an organic light emitting display device which is capable of reducing operating voltage and improving emission efficiency.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc., is actively under way.

Among these types of panel displays, the OLED devices are a type of devices that, when a charge is injected into an organic light emitting layer formed between an anode and a cathode, emit light as electron-hole pairs are produced and dissipated. The OLED devices are advantageous in that they can be formed on a flexible transparent substrate such as plastic, can be driven at relatively low voltage, less power consumption, and excellent colors sensitivity, as compared to plasma display panels or inorganic EL displays. Especially, white OLED devices are used for various purposes in lighting, thin light sources, backlights for liquid crystal displays, or full-color displays employing color filters.

An organic light emitting display device may be formed by sequentially stacking an anode, a hole injection layer, a hole transport layer, an light emitting layer, an electron transport layer, an electron injection layer, and a cathode. Accordingly, a hole-electron pair, formed by the recombination of a hole supplied from the anode and an electron received from the cathode, forms an exciton, and light emission occurs by an energy generated as the exciton returns to the ground state.

However, if the electron transport layer of an organic light emitting display device according to the related art has a high triplet exciton energy level, the operating voltage rises due to low electron injectability and low electron mobility. Also, if the electron transport layer has high electron injectability and electron affinity, the charge balance is broken due to high electron mobility, thus decreasing lifetime and efficiency.

SUMMARY

An aspect of the present invention is to provide an organic light emitting display device which is capable of reducing operating voltage and improving emission efficiency.

Additional features and advantages of the invention will be set forth in the descriptions which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an exemplary embodiment of the present invention provides an organic light emitting display device comprising at least one light emitting layer between an anode and a cathode, and an electron transport layer between the at least one light emitting layer and the cathode, the electron transport layer including a first electron transport material for blocking holes from the light emitting layer to the electron transport layer, and a second electron transport material for assisting in a transfer of electrons to the light emitting layer, wherein the first electron transport material and the second transport material have triplet exciton energy levels and electron motilities.

The triplet exciton energy level of the first electron transport material may be higher than that of the second electron transport material.

The electron mobility of the first electron transport material may be lower than that of the second electron transport material.

The electron transport layer may be a single layer.

The electron transport layer may include a first layer, a mixed layer, and a second layer.

In one example, the first layer includes the first electron transport material, the mixed layer includes the first electron transport material and the second electron transport material, and the second layer includes the second electron transport material.

The triplet exciton energy level of the first electron transport material may be within a range of 2.6 eV to 2.8 eV, and the triplet exciton energy level of the second electron transport material is within a range of 1.6 eV to 2.0 eV.

The electron mobility of the second electron transport material may be within a range of $1 \times 10^{-3}$ $cm^2/Vs$ to $1 \times 10^{-5}$ $cm^2/Vs$.

In one example, the first electron transport material includes 30 to 50% of the sum of the first and second electron transport materials.

A ratio of the first electron transport material may be equal to or lower than a ratio of the second electron transport material.

The thickness of the electron transport layer may be within a range of 5 to 45 nm.

The thicknesses of the first and second layers may include 25% to 100% of the thickness of the mixed layer, and the thickness of the mixed layer may be within a range of 15 to 20 nm.

The first electron transport material is adjacent to the light emitting layer, and blocks holes from the light emitting layer to the electron transport layer.

The second electron transport material is adjacent to the cathode, and assists in the transfer of electrons to the light emitting layer.

The charge balance in the light emitting layer is adjusted using the first electron transport material and the second electron transport material.

An exemplary embodiment of the present invention provides an organic light emitting display device comprising at least one light emitting part between an anode and a cathode, and an electron transport layer between the at least one light emitting part and the cathode, wherein the electron transport layer is composed of a single layer having a first electron transport material and a second electron transport material.

The electron transport layer may include a first layer including the first electron transport material, a mixed layer including the first and second electron transport materials, and a second layer including the second electron transport material.

The first and second electron transport materials have different triplet exciton energy levels or different electron mobilities.

The triplet exciton energy level of the first electron transport material is higher than that of the second electron transport material.

The triplet exciton energy level of the first electron transport material may be within a range of 2.6 eV to 2.8 eV, and the triplet exciton energy level of the second electron transport material may be within a range of 1.6 eV to 2.0 eV.

The electron mobility of the first electron transport material may be lower than that of the second electron transport material.

The electron mobility of the second electron transport material may be within a range of $1 \times 10^{-3}$ $cm^2/Vs$ to $1 \times 10^{-5}$ $cm^2/Vs$.

The first electron transport material may include 30 to 50% of the sum of the first and second electron transport materials.

A ratio of the first electron transport material may be equal to or lower than a ratio of the second electron transport material.

The thickness of the electron transport layer may be within a range of 5 to 45 nm.

The thicknesses of the first and second layers include 25% to 100% of the thickness of the mixed layer, and the thickness of the mixed layer may be within a range of 15 to 20 nm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
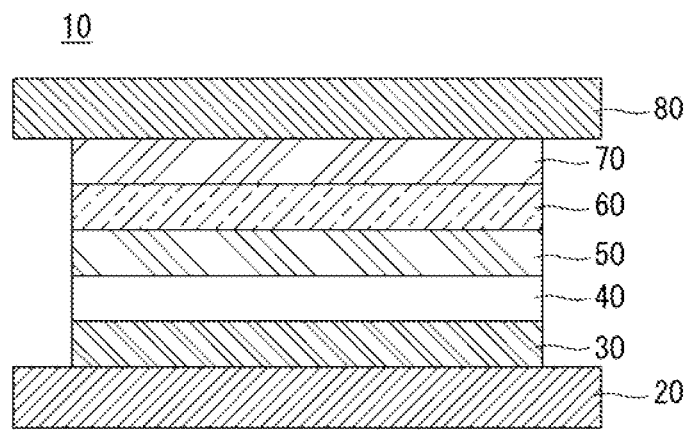
FIG. 1 is a view showing an organic light emitting display device according to a first exemplary embodiment of the present invention.

The advantages and features of the present invention and methods for accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims The shapes, sizes, percentages, angles, numbers, etc shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another either partly or wholly, and may interact or work together in technically various ways. The exemplary embodiments may be carried out independently or in combination with one another.

Hereinafter, various exemplary embodiments of the present invention will be described in detail with reference to the accompanying drawings.

FIG. 1 is a view showing an organic light emitting display device according to a first exemplary embodiment of the present invention. All the components of the organic light emitting display device in all embodiments are operatively coupled and configured.

Referring to FIG. 1, an organic light emitting display device 10 according to the first exemplary embodiment of the present invention comprises an anode 20, a hole injection layer 30, a hole transport layer 40, an light emitting layer 50, an electron transport layer 60, an electron injection layer 70, and a cathode 80.

The anode 20 is a hole injection electrode, and may be formed of ITO (indium tin oxide), IZO (indium zinc oxide), or ZnO (zinc oxide) having a high work function. Also, if the anode 20 is a reflective electrode, the anode 20 may further comprise a reflective layer formed of aluminum (Al), silver (Ag), or nickel (Ni) under a layer formed of ITO, IZO, or ZnO.

The hole injection layer 30 may function to facilitate hole injection from the anode 20 to the light emitting layer 50, and may be formed of, but is not limited to, one among of CuPc (copper phthalocyanine), PEDOT (poly(3,4)-ethylene-dioxythiophene), PANI (polyaniline), and NPD(N,N'-bis(naphthalene-1-yl)-N,N'-bis(phenyl)-2,2'-dimethylbenzidine). The hole injection layer 30 may be 1 to 150 nm thickness. If the hole injection layer 30 is 1 nm thickness or greater, the hole injection properties may be improved. If the hole injection layer 30 is 150 nm thickness or less, an increase in the thickness of the hole injection layer 30 may be prevented and a rise in operating voltage may be therefore prevented. The hole injection layer 30 or the electron injection layer 70 may not be included in the composition of the organic light emitting display device, depending on the structure or characteristics of the device.

The hole transport layer 40 may function to facilitate hole transport, and may be formed of, but is not limited to, one among of NPD (N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2, 2'7, 7'-tetrakis(N,N-diphenylamino)-9,9'-spirobifluorene), and MTDATA(4,4',4"-tris(N-3-methylphenyl-N-phenylamino)-triphenylamine). The hole transport layer 40 may be 1 to 150 nm thickness. If the hole transport layer 40 is 1 nm thickness or greater, the hole transport properties may be improved. If the hole transport layer 40 is 150 nm thickness or less, an increase in the thickness of the hole transport layer 40 may be prevented, and a rise in operating voltage may be therefore prevented.

The light emitting layer 50 may emit light of red (R), green (G), or blue (B), and may be formed of a phosphorescent material or a fluorescent material.

If the light emitting layer 50 is a red light emitting layer, it may be formed of, but is not limited to, a phosphorescent material comprising a host material such as CBP(4,4'-bis(carbazol-9-yl)biphenyl) and a dopant having one among of $Ir(PIQ)_2(acac)$ (bis (1-phenylisoquinoline)acetylacetonate iridium(III)), $Ir(PQ)_3$(bis(1-phenylquinoline)iridiuml(III)), and PtOEP(octaethylporphyrin platinum), or a fluorescent material comprising $PBD:EU(DBM)_3(Phen)$ or perylene.

If the light emitting layer 50 is a green light emitting layer, it may be formed of, but is not limited to, a phosphorescent material comprising a host material such as CBP(4,4'-bis(carbazole-9-yl)biphenyl) and a dopant material comprising an iridium-based material, or a fluorescent material comprising $Alq_3$(tris(8-hydroxyquinolinato)aluminum).

If the light emitting layer 50 is a blue light emitting layer, it may be formed of, but is not limited to, a phosphorescent material comprising a host material such as CBP(4,4'-bis(carbazole-9-yl)biphenyl) and a dopant material comprising an iridium-based material, or a fluorescent material comprising any one among of spiro-BDAVBi(2,7-bis(4-diphenylamino)styryl)-9,9-spirofluorene), spiro-CBP(2, 2', 7, 7'-tetrakis(carbazol-9-yl)-9,9-spirofluorene), distyrylbenzene (DSB), distyrylarylene (DSA), a PFO (polyfluorene) polymer, and a PPV (polyphenylenevinylne) polymer.

The electron transport layer 60 functions to facilitate electron transport, and affects the lifetime or efficiency of the organic light emitting display device. In view of this, the present inventors conducted various tests to improve the properties of the electron transport layer and therefore improve the lifetime or efficiency of the organic light emitting display device. They found out that, if the electron transport layer is composed of a single layer having a high triplet exciton energy level to reduce the operating voltage, the electron injection does not work smoothly due to low electron mobility, thus increasing the operating voltage. Also, they found out that, if the electron transport layer is formed of a single layer having high electron mobility, the electron injection works smoothly but the balance between electrons and holes is broken, thus reducing the lifetime. In view of this, they formed an electron transport layer having two layers: however the electron transport layer having two layers increased the thickness of the device, resulting in an increase in operating voltage. Therefore, the present inventors formed an electron transport layer composed of a single layer having a mixture of two materials in the electron transport layer, and invented an organic light emitting display device having a new structure that can achieve higher efficiency and lower operating voltage, depending on the properties of the two materials in the electron transport layer and the thickness or mix ratio of the two materials.

The electron transport layer 60 comprises a first electron transport material and a second electron transport material. The first electron transport material has a higher triplet exciton energy level (TI Level) and lower electron mobility than the second electron transport material. The second electron transport material has a lower triplet exciton energy level (T1 Level) and higher electron mobility than the first electron transport material. The first electron transport material and the second electron transport material may be formed by co-deposition.

More specifically, the first electron transport material has a high triplet exciton energy level (T1 Level), and therefore may function to block holes from the light emitting layer and keep the charge balance between electrons and holes in the light emitting layer. Accordingly, the first electron transport material is adjacent to the light emitting layer 50, thus preventing the transfer of holes from the light emitting layer 50 to the electron transport layer 60. The triplet exciton energy level (T1 Level) is within a range of 2.6 eV to 2.8 eV. The HOMO level of the first electron transport material is within a range of −5.9 eV to −6.3 eV, and its LUMO level is within a range of −2.4 eV to −2.8 eV. The first electron transport material having the above triplet exciton energy level, HOMO level, and LUMO level may be a carbazole compound, an oxadiazole compound, a triazole compound, etc.; for example, a compound represented by the following chemical formula 1:

[Chemical Formula 1]

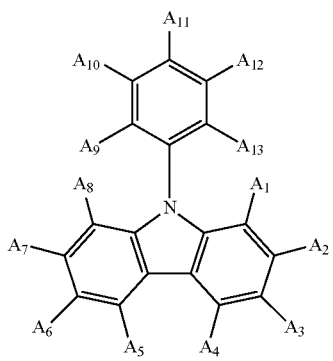

where $A_1$ to $A_{13}$ are independently a substituted or unsubstituted aromatic ring of 6 to 50 carbon atoms, or at least one of $A_1$ to $A_{13}$ is a substituted or unsubstituted heterocyclic ring of 5 to 49 carbon atoms having at least one among S, N, and O.

The second electron transport material may function to improve electron injection and reduce the operating voltage of the device since it has high electron mobility. The electron mobility is within a range of $1\times10^{-3}$ cm$^2$/Vs to $1\times10^{-5}$ cm$^2$/Vs. The HOMO level of the second electron transport material is within a range of −5.8 eV to −6.2 eV, its LUMO level is within a range from −2.8 eV to −3.2 eV, and its triplet exciton energy level is within a range 1.6 eV to 2.0 eV. The second electron transport material may be a quinoline compound, an anthracene compound, etc.; for example, a compound represented by the following chemical formula 2:

[Chemical Formula 2]

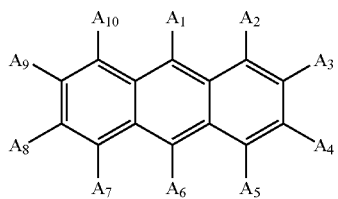

where $A_1$ to $A_{10}$ are independently a substituted or unsubstituted aromatic ring of 6 to 50 carbon atoms, or at least one of $A_1$ to $A_{10}$ is a substituted or unsubstituted heterocyclic ring of 5 to 49 carbon atoms having at least one among S, N, and O.

One or more embodiments of the present invention provide an electron transport layer comprising materials of different properties, and can therefore reduce the barrier for charges to move from adjacent layers since various energy levels are formed within the electron transport layer. Accordingly, charge transfer to the light emitting layer is facilitated, keeping the charge balance in the light emitting layer and reducing the operating voltage. And, the present invention can increase the device efficiency by comprising a first electron transport material having a high triplet exciton energy level (T1 Level). Also, the present invention can facilitate electron transfer and therefore reduce the operating voltage by comprising a second electron transport material having high electron mobility.

To reduce the operating voltage of the organic light emitting display device and improve its efficiency, the electron transport layer 60 of the present invention comprises a first electron transport material and a second electron transport material. In the electron transport layer 60, the first electron transport material includes 30 to 50% of the sum of the first and second electron transport materials. If the first electron transport material is less than 30% of the sum of the first and second electron transport materials, the device's charge balance is broken, reducing the efficiency. If the first electron transport material is more than 50% of the sum of the first and second electron transport materials, electron transfer does not work smoothly, increasing the operating voltage of the device and reducing the efficiency.

The electron transport layer 60 is formed of a single layer having a first electron transport material and a second electron transport material, and its thickness is within a range of 5 to 45 nm. If the thickness of the electron transport layer 60 is less than 5 nm, it cannot function as an electron transport layer, and if the thickness of the electron transport layer 60 is more than 45 nm, the electron transport layer becomes too thick, and therefore the operating voltage rises and the cavity effect of the device cannot be maximized.

The electron injection layer 70 functions to facilitate electron injection, and may be formed of, but is not limited to, Alq$_3$ (tris(8-hydroxy quinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), and BAlq(bis(2-methyl-8-quinolinolate)-4-(phenylphenolato)aluminum). And, the electron injection layer 70 may be formed of a metal compound, and the metal compound may be, for example, but is not limited to, one among of LiQ, LiF, NaF, KF, RbF, CsF, FrF, BeF$_2$, MgF$_2$, CaF$_2$, SrF$_2$, BaF$_2$, and RaF$_2$. The electron injection layer 70 may be 1 to 50 nm thickness. If the electron injection layer 70 is 1 nm thickness or greater, a degradation of the electron injection properties may be prevented, or if the electron injection layer 70 is 50 nm thickness or less, a rise in operating voltage caused by the electron injection layer 70 being too thick, may be prevented. The electron injection layer 70 may not be included in the composition of the organic light emitting display device, depending on the structure or characteristics of the device.

The cathode 80 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 80 may be formed thin enough to pass light therethrough. If the organic light emitting display device is a bottom-emission type, the cathode 80 may be formed thick enough to reflect light.

As described above, the organic light emitting display device according to the embodiments of the present invention offers the advantage of lowering the barrier for charges to move from adjacent layers and reducing the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first electron transport material having a high triplet exciton energy level, and facilitate electron transfer and reduce the operating voltage since the electron transport layer comprises a second electron transport material having high electron mobility.

Figure 2:
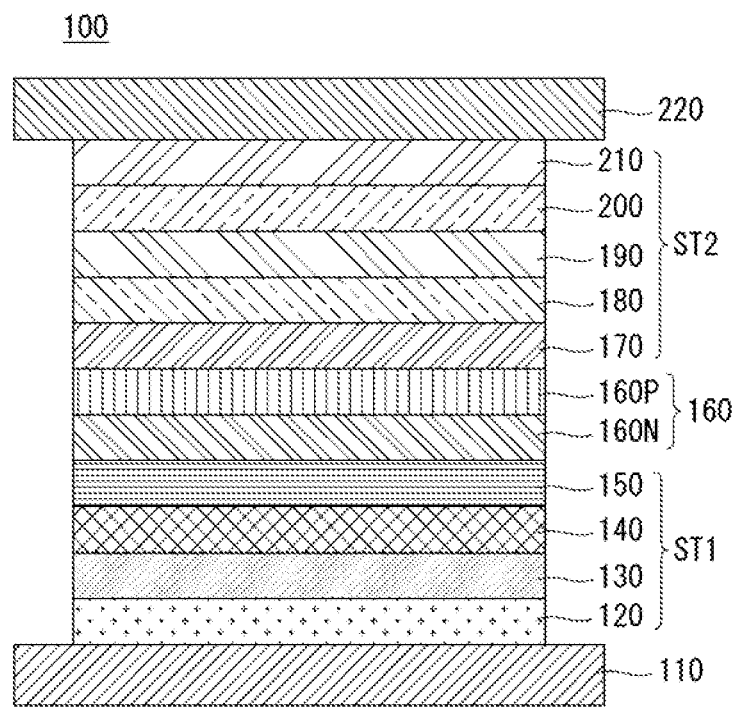
FIG. 2 is a view showing an organic light emitting display device according to a second exemplary embodiment of the present invention.

FIG. 2 is a view showing an organic light emitting display device according to a second exemplary embodiment of the present invention. Hereinbelow, the same elements as the first exemplary embodiment will be described briefly.

Referring to FIG. 2, an organic light emitting display device 100 according to the second exemplary embodiment of the present invention comprises light emitting parts ST1 and ST2 between an anode 110 and a cathode 220, and a charge generation layer 160 between the light emitting parts ST1 and ST2.

More specifically, the first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer may be a blue light emitting layer, a dark blue light emitting layer, or a sky blue light emitting layer. The first light emitting part ST1 further comprises a first hole injection layer 120 and a first hole transport layer 130 that are over the anode 110. Also, the first light emitting part ST1 further comprises a first electron transport layer 150 over the first light emitting layer 140. Also, the first light emitting part ST1 may further comprise an electron injection layer over the first electron transport layer 150. Accordingly, the first light emitting part ST1 comprising the first hole injection layer 120, the first hole transport layer 130, the first light emitting layer 140, and the first electron transport layer 150 is formed over the anode 110. The first hole injection layer 120 and the electron injection layer may not be included in the composition of the first light emitting part ST1, depending on the structure or characteristics of the device.

The second light emitting part ST2 comprising a second light emitting layer 190 is over the first light emitting part ST1. The second light emitting layer 190 may emit light of red, green, or blue, and it may be a yellow-green light emitting layer or a green light emitting layer, for example, in this exemplary embodiment. The yellow-green light emitting layer may comprise a multilayer structure of a yellow light emitting layer or yellow-green light emitting layer and a green light emitting layer. The second light emitting part ST2 further comprises a second hole injection layer 170 and a second hole transport layer 180, and further comprises a second electron transport layer 200 and an electron injection layer 210 that are over the second light emitting layer 190. Accordingly, the second light emitting part ST2 comprising the second hole injection layer 170, the second hole transport layer 180, the second light emitting layer 190, the second electron transport layer 200, and the electron injection layer 210 is formed over the first light emitting part ST1. The second hole injection layer 170 and the electron injection layer 210 may not be included in the composition of the second light emitting part ST2, depending on the structure or characteristics of the device.

The charge generation layer 160 is between the first light emitting part ST1 and the second light emitting part ST2. The charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the first light emitting layer 140 adjacent to the anode, and the P-type charge generation layer 160P supplies holes to the second light emitting layer 190. As such, the organic light emitting display device with a plurality of light emitting layers can further increase its emission efficiency and reduce its operating voltage.

The N-type charge generation layer 160N may be formed of a metal or an N-doped organic material. The metal may be one material among of Li, Na, K, Rb, Cs, Mg, Ca, Sr, Ba, La, Ce, Sm, Eu, Tb, Dy, and Yb. For example, the N-type dopant may be an alkali metal, an alkali metal compound, an alkali earth metal, or an alkali earth metal compound. The N-type dopant may be one of Li, Be, Cs, K, Rb, Mg, Na, Ca, Sr, Eu, Fr, Ba, Ra, and Yb. The host material may be one material among of Alq$_3$(tris(8-hydroxyquinolinato)aluminum, a triazine derivative, a benzazole derivative, and a silole derivative, for example.

The P-type charge generation layer 160P may be formed of a metal or a P-doped organic material. The metal may be one or more alloys of Al, Cu, Fe, Pb, Zn, Au, Pt, W, In, Mo, Ni, and Ti. A P-type dopant and host for the P-doped organic material may be commonly-used materials. For example, the P-type dopant may be one material of F$_4$-TCNQ(2,3,5,6-tetrafluoro-7,7,8,8,-tetracyan[o-quinodimethane), iodine, FeCl$_3$, FeF$_3$, and SbCl$_5$. The host may be one material among of NPB (N,N'-bis(naphthalene-1-yl)-N,N'-bis(phenyl)-benzidine), TPD(N,N'-bis-(3-methylphenyl)-N,N'-bis(phenyl)-benzidine), and TNB(N,N,N'N'-tetranaphthalenyl-benzidine).

The cathode 220 is over the second light emitting part ST2. The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

The first electron transport layer 150 in the first light emitting part ST1 of the organic light emitting display device 100 according to the second exemplary embodiment of the present invention functions to facilitate electron transport. The first electron transport layer 150 comprises a first electron transport material and a second electron transport material. The first electron transport material functions to block holes from moving and adjust the charge balance, and its triplet exciton energy level (T1 level) is within a range of −2.6 eV to −2.8 eV. The HOMO level of the first electron transport material is within a range of −5.9 eV to −6.3 eV, and its LUMO level is within a range of −2.4 eV to −2.8 eV. The second electron transport material functions to improve electron injection and reduce the operating voltage of the device, and its electron mobility is within a range of $1\times10^{-3}$ cm$^2$/Vs to $1\times10^{-5}$ cm$^2$/Vs. The HOMO level of the second electron transport material is within a range of −5.8 eV to −6.2 eV, its LUMO level is within a range of −2.8 eV to −3.2 eV, and its triplet exciton energy level is within a range of 1.6 eV to 2.0 eV.

As described above, the organic light emitting display device of the present invention can lower the barrier for charges to move from adjacent layers and reduce the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first electron transport material having a high triplet exciton energy level, and facilitate electron transfer and reduce the operating voltage since the electron transport layer comprises a second electron transport material having high electron mobility.

Figure 3:
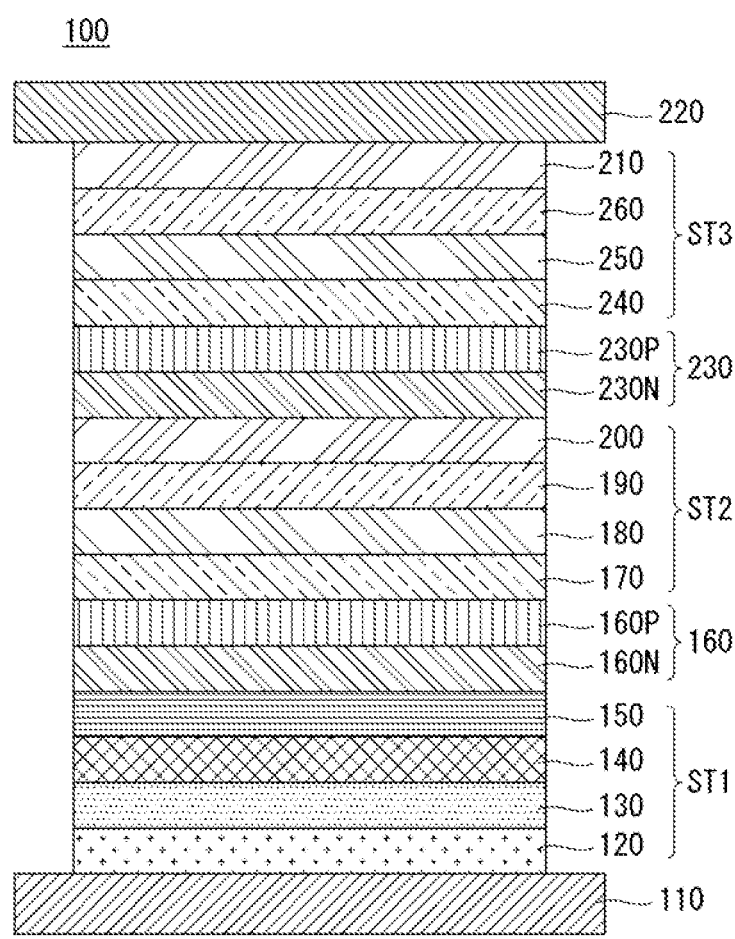
FIG. 3 is a view showing an organic light emitting display device according to a third exemplary embodiment of the present invention.

FIG. 3 is a view showing an organic light emitting display device according to a third exemplary embodiment of the present invention. The same elements as the second exemplary embodiment are denoted by the same reference numerals, so descriptions of these elements will be omitted or will be brief below.

Referring to FIG. 3, an organic light emitting display device 100 according to the third exemplary embodiment of the present invention comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present invention is not limited to this example and four or more light emitting parts may be between the anode 110 and the cathode 220.

The first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer may be a blue light emitting layer, a dark blue light emitting layer, or a sky blue light emitting layer.

The first light emitting part ST1 further comprises a first hole injection layer 120 and a first hole transport layer 130 that are over the anode 110. Also, the first light emitting part ST1 further comprises a first electron transport layer 150 over the first light emitting layer 140. Accordingly, the first light emitting part ST1 comprising the first hole injection layer 120, the first hole transport layer 130, the first light emitting layer 140, and the first electron transport layer 150 is formed over the anode 110. Also, the first light emitting part ST1 may further comprise an electron injection layer over the first electron transport layer 150.

The first hole injection layer 120 and the electron injection layer may not be included in the composition of the first light emitting part ST1, depending on the structure or characteristics of the device.

The second light emitting part ST2 is over the first light emitting part ST1. The second light emitting part ST2 comprises a second light emitting layer 190. The second light emitting layer 190 may emit light of red, green, or blue, and it may be a yellow-green light emitting layer or a green light emitting layer, for example, in this exemplary embodiment. The yellow-green light emitting layer may comprise a multilayer structure of a yellow light emitting layer or yellow-green light emitting layer and a green light emitting layer. The second light emitting part ST2 further comprises a second hole injection layer 170 and a second hole transport layer 180 that are between the first charge generation layer 160 and the second light emitting layer 190, and further comprises a second electron transport layer 200 over the second light emitting layer 190. Also, the second light emitting part ST2 may further comprise an electron injection layer over the second electron transport layer 200. Accordingly, the second light emitting part ST2 comprising the second hole injection layer 170, the second hole transport layer 180, the second light emitting layer 190, and the second electron transport layer 200 is formed over the first charge generation layer 160. The second hole injection layer 170 and the electron injection layer may not be included in the composition of the second light emitting part ST2, depending on the structure or characteristics of the device.

The first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers.

The third light emitting part ST3 comprising a third light emitting layer 250 is over the second light emitting part ST2. The third light emitting layer 250 may emit light of red, green, or blue: for example, it may be a blue light emitting layer in this exemplary embodiment. The blue light emitting layer may be a blue light emitting layer, a dark blue light emitting layer, or a sky blue light emitting layer. The third light emitting part ST3 further comprises a third hole transport layer 240 between the second charge generation layer 230 and the third light emitting layer 250, and further comprises a third electron transport layer 260 and an electron injection layer 210 that are over the third light emitting layer 250. Accordingly, the third light emitting part ST3 comprising the third hole transport layer 240, the third light emitting layer 250, the third electron transport layer 260, and the electron injection layer 210 is formed over the second charge generation layer 230. The cathode 220 is provided over the third light emitting part ST3, constituting the organic light emitting display device according to the second exemplary embodiment of the present invention. The third hole transport layer 240 and the electron injection layer 210 may not be included in the composition of the third light emitting part ST3, depending on the structure or characteristics of the device.

The second charge generation layer 230 is between the second light emitting part ST2 and the third light emitting part ST3. The second charge generation layer 230 is a PN-junction charge generation layer formed by joining an N-type charge generation layer 230N and a P-type charge generation layer 230P. The PN junction charge generation layer 230 generates a charge, or injects the charge, i.e., electrons and holes, separately into the light emitting layers.

The third electron transport layer 260 in the third light emitting part ST3 of the organic light emitting display device 100 according to the third exemplary embodiment of the present invention functions to facilitate electron transport. The third electron transport layer 260 comprises a first electron transport material and a second electron transport material. The first electron transport material functions to block holes from moving and maintain the charge balance, and its triplet exciton energy level (T1 level) is within a range of 2.6 eV to 2.8 eV. The HOMO level of the first electron transport material is within a range of −5.9 eV to −6.3 eV, and its LUMO level is within a range of −2.4 eV to −2.8 eV. The second electron transport material functions to improve electron injection and reduce the operating voltage of the device, and its electron mobility is within a range of $1 \times 10^{-3}$ cm$^2$/Vs to $1 \times 10^{-5}$ cm$^2$/Vs. The HOMO level of the second electron transport material is within a range of −5.8 eV to −6.2 eV, its LUMO level is within a range of −2.8 eV to −3.2 eV, and its triplet exciton energy level is within a range of 1.6 eV to 2.0 eV.

In the organic light emitting display device 100 according to the third exemplary embodiment of the present invention, the first electron transport layer 150 of the first light emitting part ST1 may have the same composition as the third electron transport layer 260 of the third light emitting part ST3. That is, the first electron transport layer 150 of the first light emitting part ST1 may comprise the above-described first electron transport material and second electron transport material. The electron transport layer comprising the first and second electron transport materials of the present invention may be applicable to any light emitting part that emits blue light.

As described above, the organic light emitting display device of the present invention can lower the barrier for charges to move from adjacent layers and reduce the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first electron transport material having a high triplet exciton energy level, and facilitate electron transfer and reduce the operating voltage since the electron transport layer comprises a second electron transport material having high electron mobility.

Figure 4:
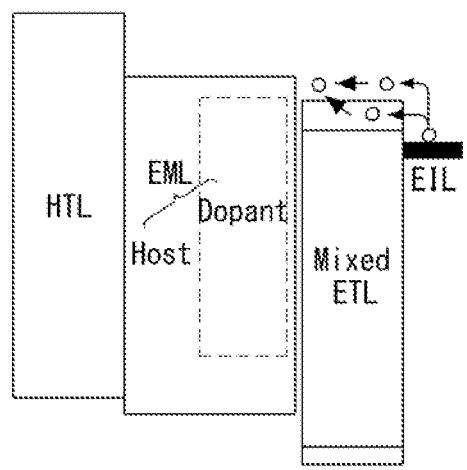
FIG. 4 is an energy band diagram of an organic light emitting display device according to an exemplary embodiment of the present invention.

FIG. 4 is an energy band diagram of an organic light emitting display device according to an exemplary embodiment of the present invention.

Referring to FIG. 4, the organic light emitting display device according to the present invention comprises a hole transport layer HTL, an light emitting layer EML having a host and a dopant, an electron transport layer Mixed ETL, and an electron injection layer EIL. The electron transport layer Mixed ETL is an electron transport layer formed of a mixture of a first electron transport material and a second electron transport material. In the electron transport layer Mixed ETL, the first electron transport material having a high triplet exciton energy level has one band gap, and the second electron transport material having high electron mobility has another band gap. Accordingly, mixing two materials with different band gaps together can lower the barrier to the transfer of carriers moving from the adjacent electron injection layer EIL or cathode, facilitating the transfer of carriers to the light emitting layer EML. Moreover, the first electron transport material having a high triplet exciton energy level can block holes from moving from the light emitting layer EML to the electron transport layer Mixed ETL, thereby improving the efficiency of the light emitting layer EML. In addition, the second electron transport material having high electron mobility can improve electron injectability into the light emitting layer EML, thereby reducing the operating voltage of the device.

The electron transport layer of the organic light emitting display device of the present invention may have a three-layer structure of a first layer, a mixed layer, and a second layer. In the following, exemplary embodiments in which the electron transport layer has the above three-layer structure are disclosed. Except, the same components as those of the foregoing first to third exemplary embodiments are given the same reference numerals for better comprehension and ease of description.

Figure 5:
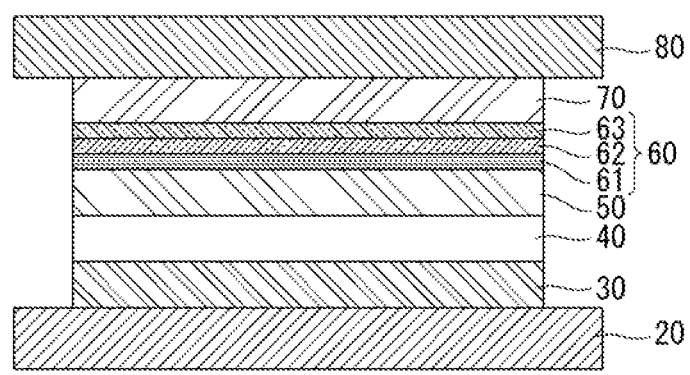
FIG. 5 is a view showing an organic light emitting display device according to a fourth exemplary embodiment of the present invention.

FIG. 5 is a view showing an organic light emitting display device according to a fourth exemplary embodiment of the present invention.

Referring to FIG. 5, an organic light emitting display device 10 according to the fourth exemplary embodiment of the present invention may comprise an anode 20, a hole injection layer 30, a hole transport layer 40, an light emitting layer 50, an electron transport layer 60, an electron injection layer 70, and a cathode 80.

The anode 20 is an electrode that injects holes into the light emitting layer 50, and the hole injection layer 30 and the hole transport layer 40 function to facilitate hole injection from the anode 20 to the light emitting layer 50. The hole injection layer 30 or the hole transport layer 40 may not be included in the composition of the organic light emitting display device depending on the structure or characteristics of the device. The light emitting layer 50 may emit light of red (R), green (G), or blue (B), and may be formed of a phosphorescent material or a fluorescent material. The electron transport layer 60 is over the light emitting layer 50, and the electron injection layer 70 is over the electron transport layer 60 to facilitate electron injection. The cathode 80 is an electron injection electrode, and over the electron injection layer 70.

The electron transport layer 60 functions to facilitate electron transport, and affects the lifetime or efficiency of the organic light emitting display device. In view of this, the present inventors conducted various tests to improve the properties of the electron transport layer and therefore improve the lifetime or efficiency of the organic light emitting display device. They found out that, if the electron transport layer is composed of a single layer having a high triplet exciton energy level to reduce the operating voltage, the electron injection does not work smoothly due to low electron mobility, thus increasing the operating voltage. Also, they found out that, if the electron transport layer is composed of a single layer having high electron mobility, the electron injection works smoothly but the balance between electrons and holes is broken, thus reducing the lifetime. In view of this, they formed an electron transport layer having two layers: however the electron transport layer having two layers increased the thickness of the device, resulting in an increase in operating voltage. Therefore, the present inventors formed an electron transport layer having three layers including a first layer of a first electron transport material, a second layer of a second electron transport material, and a third layer formed of a mixture of the first and second electron transport materials and between the first layer and the second layer, without increasing the thickness of the electron transport layer. Also, the present inventors invented an organic light emitting display device having a new structure that can achieve higher efficiency and lower operating voltage, depending on the properties and thicknesses of the first and second electron transport materials included in the electron transport layer and the thickness and mix ratio of the mixed layer.

The electron transport layer 60 comprises a first layer 61 adjacent to the light emitting layer 50, a mixed layer 62 over the first layer 61, and a second layer 63 over the mixed layer 62. The first layer 61 includes the first electron transport material, and functions as a buffer between the light emitting layer 50 and the mixed layer 62. The first electron transport material in the first layer 61 has a higher triplet exciton energy level (T1 Level) and lower electron mobility than the second electron transport material. The second layer 63 includes the second electron transport material, and functions as a buffer between the electron transport layer 70 or cathode 80 and the mixed layer 62. The second electron transport material in the second layer 63 has a lower triplet exciton energy level (T1 Level) and higher electron mobility than the first electron transport material. The mixed layer 62 is between the first layer 61 and the second layer 63, and includes a mixture of the first and second electron transport materials. The mixed layer 62 functions to facilitate charge transfer to the light emitting layer 50.

The first layer 61 of the electron transport layer is adjacent to the light emitting layer 60. The first layer 61 comprises a first electron transport material having a high triplet exciton energy level (T1 Level), and therefore may function to block holes from moving from the hole transport layer 40 and keep the charge balance between electrons and holes in the light emitting layer 50. Accordingly, the first layer 61 of the electron transport layer 60 is adjacent to the light emitting layer 50, thus preventing the transfer of holes from the light emitting layer 50 to the electron transport layer 60. The triplet exciton energy level (T1 Level) of the first electron transport material is within a range of 2.6 eV to 2.8 eV. The HOMO level of the first electron transport material is within a range of −5.9 eV to −6.3 eV, and its LUMO level is within a range of −2.4 eV to −2.8 eV. The first electron transport material having the above triplet exciton energy level, HOMO level, and LUMO level may be a carbazole compound, an oxadiazole compound, a triazole compound, etc.; for example, a compound represented by the above-mentioned chemical formula 1.

The second layer 63 of the electron transport layer is adjacent to the electron injection layer 70 or the cathode 80. The second layer 63 may function to improve electron injection from the electron injection layer 70 or the cathode 80 and reduce the operating voltage of the device since it comprises a second electron transport material having high electron mobility. Accordingly, the second layer 63 of the electron transport layer 60, being adjacent to the electron injection layer 70 or the cathode 80, may assist in the transfer of electrons to the light emitting layer 50. The electron mobility of the second electron transport material is within a range of $1 \times 10^{-3}$ cm$^2$/Vs to $1 \times 10^{-5}$ cm$^2$/Vs. The HOMO level of the second electron transport material is within a range of −5.8 eV to −6.2 eV, its LUMO level is within a range of −2.8 eV to −3.2 eV, and its triplet exciton energy level is within a range of 1.6 eV to 2.0 eV. The second electron transport material may be a quinoline compound, an anthracene compound, etc.; for example, a compound represented by the above-mentioned chemical formula 2.

The mixed layer 62 of the electron transport layer 60 is between the first layer 61 and the second layer 63, and includes a mixture of the first and second electron transport materials. The mixed layer 62 comprises the first electron transport material, and therefore may function to block holes from moving from the hole transport layer 40 and maintain the charge balance between electrons and holes in the light emitting layer 50. Also, the mixed layer 62 comprises the second electron transport material, and can improve electron injection and reduce the operating voltage of the device.

By comprising the first layer 61 having the first electron transport material, the mixed layer 62 having a mixture of the first and second electron transport materials, and the second layer 63 having the second electron transport material, various energy levels are formed in the electron transport layer 60, thereby lowering the barrier for charges to move from adjacent layers. Accordingly, electron transfer to the light emitting layer 50 can be facilitated, and the operating voltage can be reduced.

Moreover, the electron transport layer 60 of the present invention can increase the device efficiency of transport from the mixed layer 62 to the light emitting layer 50 since the electron transport layer 60 comprises the first layer 61 comprising the first electron transport material having a high triplet exciton energy level.

The mixed layer 62 of the electron transport layer 60 of the present invention includes a mixture of the first electron transport material and the second electron transport material. In the electron transport layer 60, the first electron transport material includes 30 to 50% of the sum of the first and second electron transport materials. If the first electron transport material includes less than 30% of the sum of the first and second electron transport materials, the device's charge balance is broken, lowering the efficiency. If the first electron transport material includes more than 50% of the sum of the first and second electron transport materials, electron transfer does not work smoothly, increasing the operating voltage of the device and lowering the efficiency.

The electron transport layer 60 according to the fourth exemplary embodiment of the present invention further comprises the first layer 61 and the second layer 63, in addition to the mixed layer 62 of the electron transport layer 60 the third exemplary embodiment, but the entire thickness of the electron transport layer 60 is not increased.

Accordingly, the electron transport layer 60 having three layers, and the entire thickness of the three layers ranges from 5 to 45 nm. If the entire thickness of the electron transport layer 60 is less than 5 nm, it cannot function as an electron transport layer, and if the entire thickness of the electron transport layer 60 is more than 45 nm, the electron transport layer becomes too thick, and therefore the operating voltage rises and the cavity effect of the device cannot be maximized.

The thickness of the first layer 61 of the electron transport layer 60 is 25% to 100% of the thickness of the mixed layer 62. If the thickness of the first layer 61 is 25% or more of the thickness of the mixed layer 62, this blocks holes from moving from the hole transport layer and maintains the charge balance of the light emitting layer, thereby improving the device efficiency. If the thickness of the first layer 61 is 100% or less of the thickness of the mixed layer 62, this prevents the mixed layer 62 from becoming relatively thin, thereby preventing degradation of the device efficiency.

The thickness of the second layer 63 of the electron transport layer 60 is 25% to 100% of the thickness of the mixed layer 62. If the thickness of the second layer 63 is 25% or more of the thickness of the mixed layer 62, this lowers the charge barrier for electrons to move from the hole injection layer 70 or the cathode 80, thereby improving the device efficiency. If the thickness of the second layer 63 is 100% or less of the thickness of the mixed layer 62, this prevents the mixed layer 62 from becoming relatively thin, thereby preventing degradation of the device efficiency.

As described above, the organic light emitting display device of the present invention offers the advantage of lowering the barrier for charges to move from adjacent layers and reducing the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first layer comprising a first electron transport material having a high triplet exciton energy level, and facilitate electron transfer and reduce the operating voltage since the electron transport layer comprises a second layer comprising a second electron transport material having high electron mobility.

Figure 6:
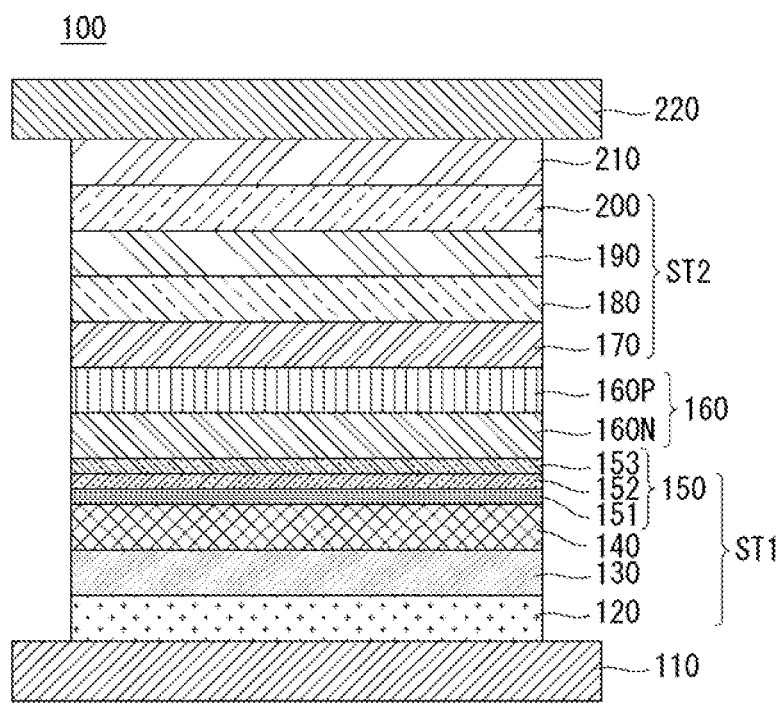
FIG. 6 is a view showing an organic light emitting display device according to a fifth exemplary embodiment of the present invention.

FIG. 6 is a view showing an organic light emitting display device according to a fifth exemplary embodiment of the present invention. Hereinbelow, the same elements as the second exemplary embodiment will be described briefly.

Referring to FIG. 6, an organic light emitting display device 100 according to the fifth exemplary embodiment of the present invention comprises light emitting parts ST1 and ST2 between an anode 110 and a cathode 220, and a charge generation layer 160 between the light emitting parts ST1 and ST2.

The first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer may be a blue light emitting layer, a dark blue light emitting layer, or a sky blue light emitting layer. The first light emitting part ST1 further comprises a first hole injection layer 120 and a first hole transport layer 130 that are between the anode 110 and the first light emitting layer 140. Also, the first light emitting part ST1 further comprises a first electron transport layer 150 over the first light emitting layer 140. Also, the first light emitting part ST1 may further comprise an electron injection layer over the first electron transport layer 150. Accordingly, the first light emitting part ST1 comprising the first hole injection layer 120, the first hole transport layer 130, the first light emitting layer 140, and the first electron transport layer 150 is formed over the anode 110. The first hole injection layer 120 and the electron injection layer may not be included in the composition of the first light emitting part ST1, depending on the structure or characteristics of the device.

The second light emitting part ST2 comprising a second light emitting layer 190 is over the first light emitting part ST1. The second light emitting layer 190 may emit light of red, green, or blue, and it may be a yellow-green light emitting layer or a green light emitting layer, for example, in this exemplary embodiment. The yellow-green light emitting layer may comprise a multilayer structure of a yellow light emitting layer or yellow-green light emitting layer and a green light emitting layer. The second light emitting part ST2 further comprises a second hole injection layer 170 and a second hole transport layer 180, and further comprises a second electron transport layer 200 and an electron injection layer 210 that are over the second light emitting layer 190. Accordingly, the second light emitting part ST2 comprising the second hole injection layer 170, the second hole transport layer 180, the second light emitting layer 190, the second electron transport layer 200, and the electron injection layer 210 is formed over the first light emitting part ST1. The second hole injection layer 170 and the electron injection layer 210 may not be included in the composition of the second light emitting part ST2, depending on the structure or characteristics of the device.

The charge generation layer 160 is between the first light emitting part ST1 and the second light emitting part ST2. The charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the first light emitting layer 140 adjacent to the anode, and the P-type charge generation layer 160P supplies holes to the second light emitting layer 190 of the second light emitting part ST2. As such, the organic light emitting display device with a plurality of light emitting layers can further increase its emission efficiency and lower its operating voltage. The anode 220 is over the second light emitting part ST2.

The first electron transport layer 150 in the first light emitting part ST1 of the organic light emitting display device 100 according to the fifth exemplary embodiment of the present invention functions to facilitate electron transport. The first electron transport layer 150 comprises a first layer 151 adjacent to the first light emitting layer 140, a mixed layer 152 over the first layer 151, and a second layer 153 over the mixed layer 152. The first layer 151 comprises a first electron transport material having a high triplet exciton energy level (T1 Level), and therefore may function to block holes from moving from the first hole transport layer 130 and maintain the charge balance between electrons and holes in the first light emitting layer 140. The triplet exciton energy level (T1 Level) of the first electron transport material is within a range of 2.6 eV to 2.8 eV. The HOMO level of the first electron transport material is within a range of −5.9 eV to −6.3 eV, and its LUMO level is within a range of −2.4 eV to −2.8 eV. The second layer 153 may function to improve electron injection from the cathode 220 and reduce the operating voltage of the device since it comprises a second electron transport material having high electron mobility. The electron mobility of the second electron transport material is within a range of $1\times10^{-3}$ $cm^2/Vs$ to $1\times10^{-5}$ $cm^2/Vs$. The HOMO level of the second electron transport material is within a range of −5.8 eV to −6.2 eV, its LUMO level is within a range of −2.8 eV to −3.2 eV, and its triplet exciton energy level is within a range of 1.6 eV to 2.0 eV. The mixed layer 152 is between the first layer 151 and the second layer 153, and includes a mixture of the first and second electron transport materials. The mixed layer 152 comprises the first electron transport material, and therefore may function to block holes from moving from the first light emitting layer 140 and maintain the charge balance between electrons and holes in the first light emitting layer 140. Also, the mixed layer 152 comprises the second electron transport material, and can improve electron injection and reduce the operating voltage of the device.

As described above, the organic light emitting display device of the present invention offers the advantage of lowering the barrier for charges to move from adjacent layers and reducing the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first layer comprising a first electron transport material having a high triplet exciton energy level, and facilitate electron transfer and reduce the operating voltage since the electron transport layer comprises a second layer comprising a second electron transport material having high electron mobility.

Figure 7:
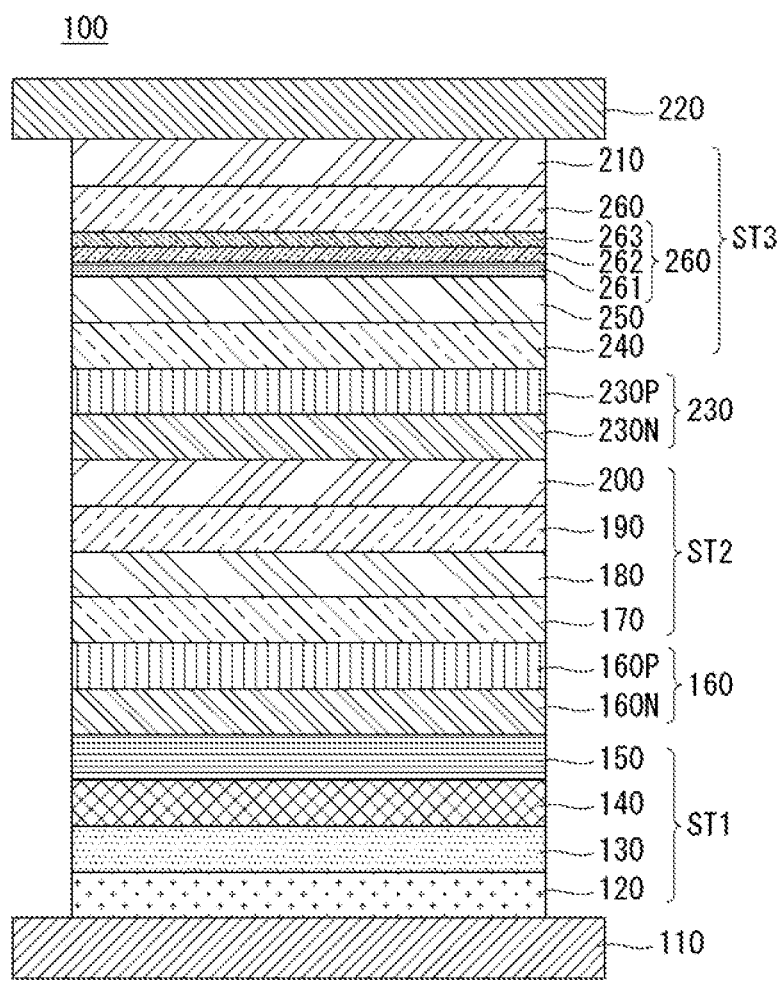
FIG. 7 is a view showing an organic light emitting display device according to a sixth exemplary embodiment of the present invention.

FIG. 7 is a view showing an organic light emitting display device according to a sixth exemplary embodiment of the present invention. The same elements as the fifth exemplary embodiment are denoted by the same reference numerals, so descriptions of these elements will be omitted below.

Referring to FIG. 7, an organic light emitting display device 100 according to the sixth exemplary embodiment of the present invention comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present invention is not limited to this example and four or more light emitting parts may be between the anode 110 and the cathode 220.

The first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer may be a blue light emitting layer, a dark blue light emitting layer, or a sky blue light emitting layer.

The first light emitting part ST1 further comprises a first hole injection layer 120 and a first hole transport layer 130 that are between the anode 110 and the first light emitting layer 140. Also, the first light emitting part ST1 further comprises a first electron transport layer 150 over the first light emitting layer 140. Also, the first light emitting part ST1 may further comprise an electron injection layer over the first electron transport layer 150. Accordingly, the first light emitting part ST1 comprising the first hole injection layer 120, the first hole transport layer 130, the first light emitting layer 140, and the first electron transport layer 150 is formed over the anode 110. The first hole injection layer 120 and the electron transport layer may not be included in the composition of the first light emitting part ST1, depending on the structure or characteristics of the device.

The second light emitting part ST2 comprising a second light emitting layer 190 is over the first light emitting part ST1. The second light emitting layer 190 may emit light of red, green, or blue, and it may be a yellow-green light emitting layer or a green light emitting layer, for example, in this exemplary embodiment. The yellow-green light emitting layer may comprise a multilayer structure of a yellow light emitting layer or yellow-green light emitting layer and a green light emitting layer. The second light emitting part ST2 further comprises a second hole injection layer 170 and a second hole transport layer 180 that are between the first charge generation layer 160 and the second light emitting layer 190, and further comprises a second electron transport layer 200 over the second light emitting layer 190. Also, the second light emitting part ST2 may further comprise an electron injection layer over the second electron transport layer 200. Accordingly, the second light emitting part ST2 comprising the second hole injection layer 170, the second hole transport layer 180, the second light emitting layer 190, and the second electron transport layer 200 is formed over the first light emitting part ST1. The second hole injection layer 170 and the electron injection layer may not be included in the composition of the second light emitting part ST2, depending on the structure or characteristics of the device.

The charge generation layer 160 is between the first light emitting part ST1 and the second light emitting part ST2. The charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers.

The third light emitting part ST3 comprising a third light emitting layer 250 is over the second light emitting part ST2. The third light emitting layer 250 may emit light of red, green, or blue: for example, it may be a blue light emitting layer in this exemplary embodiment. The blue light emitting layer may be a blue light emitting layer, a dark blue light emitting layer, or a sky blue light emitting layer. The third light emitting part ST3 further comprises a third hole transport layer 240 between the second charge generation layer 230 and the third light emitting layer 250, and further comprises a third electron transport layer 260 and an electron injection layer 210 that are over the third light emitting layer 250. Also, the third light emitting part ST3 may further comprise a hole injection layer under the third hole transport layer 240. Accordingly, the third light emitting part ST3 comprising the third hole transport layer 240, the third light emitting layer 250, the third electron transport layer 260, and the electron injection layer 210 is formed over the second charge generation layer 230. The cathode 220 is provided over the third light emitting part ST3, constituting the organic light emitting display device according to the sixth exemplary embodiment of the present invention. The hole injection layer and the electron injection layer 210 may not be included in the composition of the third light emitting part ST3, depending on the structure or characteristics of the device.

The third electron transport layer 260 in the third light emitting part ST3 of the organic light emitting display device 100 according to the sixth exemplary embodiment of the present invention functions to facilitate electron transport. The third electron transport layer 260 comprises a first layer 261 adjacent to the third light emitting layer 250, a mixed layer 262 over the first layer 261, and a second layer 263 over the mixed layer 262. The first layer 261 comprises a first electron transport material having a high triplet exciton energy level (T1 Level), and therefore may function to block holes from moving from the third hole transport layer 260 and maintain the charge balance between electrons and holes in the third light emitting layer 250. The triplet exciton energy level (T1 Level) of the first electron transport material is within a range of 2.6 eV to 2.8 eV. The HOMO level of the first electron transport material is within a range of −5.9 eV to −6.3 eV, and its LUMO level is within a range of −2.4 eV to −2.8 eV. The second layer 263 may function to improve electron injection from the cathode 220 and reduce the operating voltage of the device since it comprises a second electron transport material having high electron mobility. The electron mobility of the second electron transport material is within a range of $1\times10^{-3}$ cm$^2$/Vs to $1\times10^{-5}$ cm$^2$/Vs. The HOMO level of the second electron transport material is within a range of −5.8 eV to −6.2 eV, its LUMO level is within a range of −2.8 eV to −3.2 eV, and its triplet exciton energy level is within a range of 1.6 eV to 2.0 eV. The mixed layer 262 is between the first layer 261 and the second layer 263, and includes a mixture of the first and second electron transport materials. The mixed layer 262 comprises the first electron transport material, and therefore may function to block holes from moving from the third light emitting layer 250 and maintain the charge balance between electrons and holes in the third light emitting layer 250. Also, the mixed layer 262 comprises the second electron transport material, and can improve electron injection and reduce the operating voltage of the device.

In the organic light emitting display device 100 according to the sixth exemplary embodiment of the present invention, the first electron transport layer 150 of the first light emitting part ST1 may have the same composition as the third electron transport layer 260 of the third light emitting part ST3. That is, the first electron transport layer 150 of the first light emitting part ST1 may comprise a first layer comprising the first electron transport material, a mixed layer comprising a mixture of the first and second electron transport materials, and a second layer comprising the second electron transport material. The first electron transport layer 150 may comprise the first layer, the mixed layer, and the second layer. The electron transport layer having a three-layer structure comprising the first and second electron transport materials of the present invention may be applicable to any light emitting part that emits blue light.

As described above, the organic light emitting display device of the present invention offers the advantage of lowering the barrier for charges to move from adjacent layers and reducing the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first layer comprising a first electron transport material having a high triplet exciton energy level, and facilitate electron transfer and reduce the operating voltage since the electron transport layer comprises a second layer comprising a second electron transport material having high electron mobility.

Figure 8:
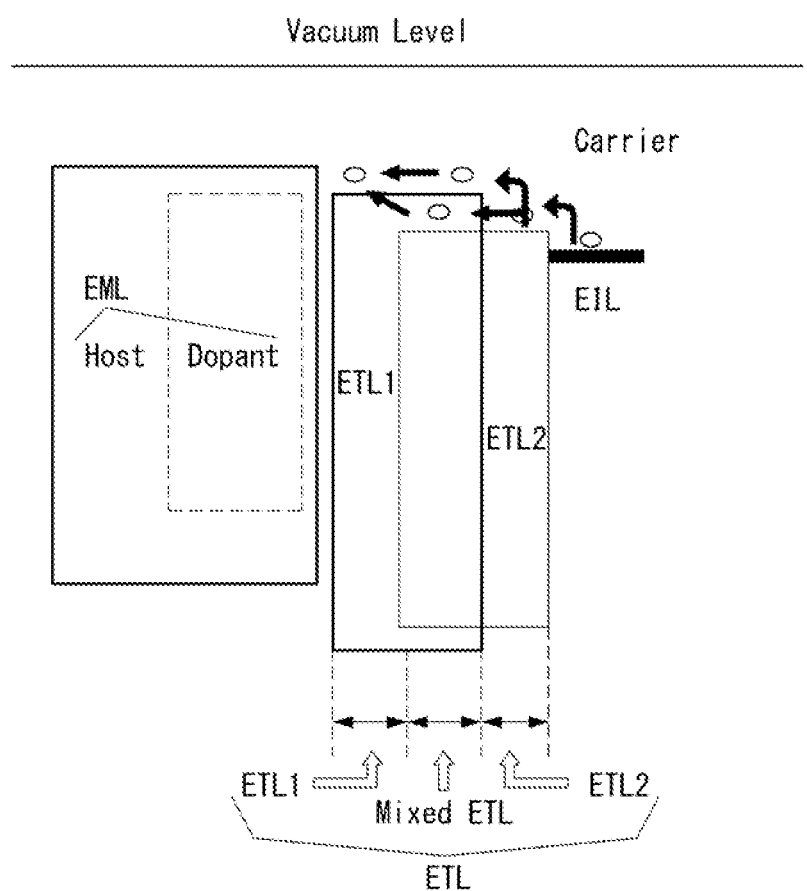
FIG. 8 is an energy band diagram of an organic light emitting display device according to the fourth exemplary embodiment of the present invention.

FIG. 8 is an energy band diagram of an organic light emitting display device according to the fourth exemplary embodiment of the present invention.

Referring to FIG. 8, the organic light emitting display device according to the present invention comprises an light emitting layer EML having a host and a dopant, an electron transport layer ETL, and an electron injection layer EIL. The electron transport layer ETL comprises a first layer ETL1 comprising a first electron transport material, a second layer ETL2 comprising a second electron transport material, and a mixed layer Mixed ETL comprising a mixture of the first and second electron transport materials.

In the first layer ETL1, the first electron transport material having a high triplet exciton energy level has one band gap, and in the second layer ETL2, the second electron transport material having high electron mobility has another band gap. In the mixed layer Mixed ETL, the first electron transport material and the second electron transport material has band gaps, respectively. Carriers injected from the adjacent electron injection layer EIL or cathode may easily move to the second layer ETL2 across the band gap of the second electron transport material of the second layer ETL2. Carriers that have reached the second layer ETL2 may easily move to the mixed layer Mixed ETL along the band gap of the same second electron transport material formed in the mixed layer Mixed ETL, or may move to the mixed layer Mixed ETL across the band gap of the first electron transport material in the mixed layer Mixed ETL. Among the carriers that have reached the mixed layer Mixed ETL, ones existing in the band gap of the second electron transport material may move to the first layer ETL1 across the band gap of the first electron transport material formed in the first layer ETL1, and ones existing in the band gap of the first electron transport material may easily move to the first layer ETL1 along the band gap of the same first electron transport material. That is, the electron transport layer comprising the first layer ETL1, the mixed layer Mixed ETL, and the second layer ETL2 can lower the barrier to the transfer of carriers moving from the adjacent electron injection layer EIL or cathode, facilitating the transfer of carriers to the light emitting layer EML. Moreover, the first electron transport material having a high triplet exciton energy level can block holes from moving from the light emitting layer EML to the electron transport layer ETL, thereby improving the efficiency. In addition, the second electron transport material having high electron mobility can improve electron injectability, thereby reducing the operating voltage of the device.

Figure 9:
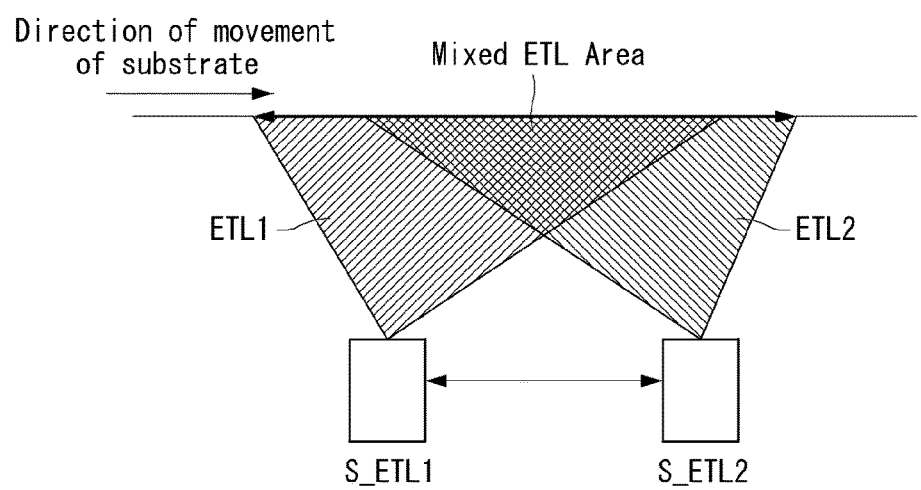
FIG. 9 is a pattern diagram of a co-deposition method for producing an electron transport layer of an organic light emitting display device according to an embodiment of the present invention.

FIG. 9 is a pattern diagram of a co-deposition method for producing an electron transport layer of an organic light emitting display device according to the present invention.

Referring to FIG. 9, the electron transport layer of the organic light emitting display device according to the present invention is formed by a co-deposition method. A first deposition source S_ETL1 with a first electron transport material ETL1 and a second deposition source S_ETL2 with a second electron transport material ETL2 are provided on the bottom of a chamber, and a substrate is mounted in such a way that an light emitting layer surface faces the deposition sources and provided on top of the chamber. When the substrate is moved in one direction of the chamber, the first deposition source S_ETL1 and the second deposition source S_ETL2 start the deposition of the first and second electron transport materials. As the substrate is moved, the first electron transport material ETL1 evaporated from the first deposition source S_ETL1 is deposited on the substrate to form a first layer, then the first electron transport material ETL1 and the second electron transport material ETL2 are simultaneously deposited to form a mixed layer, and finally the second electron transport material ETL2 evaporated from the second deposition source S_ETL2 is deposited to form a second layer. Thus, the electron transport layer according to the fourth to sixth exemplary embodiments of the present invention is produced.

On the other hand, both the first electron transport material and the second electron transport material may be simultaneously deposited on the substrate by reducing the distance between the first deposition source S_ETL1 and the second deposition source S_ETL2. Thus, the electron transport layer according to the first to third exemplary embodiments may be produced. Therefore, the electron transport layer may have various structures by adjusting the distance between the deposition sources.

Hereinafter, embodiments for the manufacture of an organic light emitting display device according to the present invention will be disclosed. However, the following materials for the electron transport layer do not limit the scope of the present invention.

Test 1: Characteristics of Device with Electron Transport Layer Formed of Mixed Material Compared to Single Material

COMPARATIVE EXAMPLE 1

A device comprising a hole injection layer, a hole transport layer, an light emitting layer, an electron transport layer, an electron injection layer, and a cathode was formed on a substrate. The light emitting layer was a blue light emitting layer, and an oxadiazole compound was used as the electron transport layer. The device used in testing was a mono device.

COMPARATIVE EXAMPLE 2

An organic light emitting display device having the same composition as Comparative Example 1 was manufactured by using a quinoline compound as the electron transport layer.

<Embodiment 1>

An organic light emitting display device having the same composition as Comparative Example 1 was manufactured by using a mixture of an oxadiazole compound and a quinoline compound as the electron transport layer.

The materials for the electron transport layer used in Comparative Examples 1 and 2 and Embodiment 1 do not limit the scope of the present invention.

The operating voltage and emission efficiency of the devices manufactured according to Comparative Example 1 and Embodiment 1 were measured and shown in the following Table 1. The operating voltage and emission efficiency of the devices manufactured according to Comparative Example 2 and Embodiment 1 were measured and shown in the following Table 2. In the following Table 1, the measurements taken from Embodiment 1 were expressed as a percentage relative to those taken from Comparative Example 1 corresponding to 100%. In the following Table 2, the measurements taken from Embodiment 1 were expressed as a percentage relative to those taken from Comparative Example 2 corresponding to 100%.

TABLE 1

|  | Comparative Example 1 | Embodiment 1 |
|---|---|---|
| Operating Voltage | 100% | 58% |
| Emission Efficiency | 100% | 172% |

TABLE 2

|  | Comparative Example 1 | Embodiment 1 |
|---|---|---|
| Operating Voltage | 100% | 110% |
| Emission Efficiency | 100% | 121% |

Referring to Table 1, the device of Embodiment 1 comprising an electron transport layer formed of a mixture of a material with a high triplet exciton energy level and a material with a high charge mobility showed a decrease in operating voltage and a 72% increase in emission efficiency, compared to the device of Comparative Example 1 comprising an electron transport layer formed solely of a material with a high triplet exciton energy level. Also, referring to Table 2, the device of Embodiment 1 comprising an electron transport layer formed of a mixture of a material with a high triplet exciton energy level and a material with a high charge mobility showed a 21% increase in emission efficiency, though there was some increase in operating voltage, compared to the device of Comparative Example 2 comprising an electron transport layer formed solely of a material with a high charge mobility.

Test 2: Characteristics of Device Depending on Ratio of Materials of Electron Transport Layer <Embodiment 2>

Devices were manufactured by mixing an oxadiazole compound and a quinoline compound in different ratios: 7:3, 1:1, and 3:7 for an electron transport layer, under the same process condition as Embodiment 1. Here, the ratio may refer to the portion of occupied volume within the electron transport layer.

The materials for the electron transport layer of Embodiment 2 do not limit the scope of the present invention.

The operating voltage and emission efficiency of the devices manufactured according to Embodiment 2 were measured and shown in the following Table 3. The current density vs. operating voltage was measured and shown in FIG. 10, and the efficiency vs. luminance was measured and shown in FIG. 11. Also, the luminescence intensity vs. wavelength of the devices manufactured using 1:1 and 3:7 mix ratios of materials in the electron transport layer according to Embodiment 2 was measured and shown in FIG. 12, and the emission intensity vs. wavelength of the devices manufactured using 1:1 and 7:3 mix ratios of materials for the electron transport layer according to Embodiment 2 was measured and shown in FIG. 13. In the following Table 3, the measurements taken from the devices manufactured using the 7:3 and 3:7 mix ratios were expressed as a percentage relative to those taken from the device manufactured using the 1:1 mix ratio, corresponding to 100%.

TABLE 3

|  | Mix Ratio for Electron Transport Layer | | |
|---|---|---|---|
|  | 7:3 | 1:1 | 3:7 |
| Operating Voltage | 141.3% | 100.0% | 89.1% |
| Emission Efficiency | 70.9% | 100.0% | 100.0% |

Figure 10:
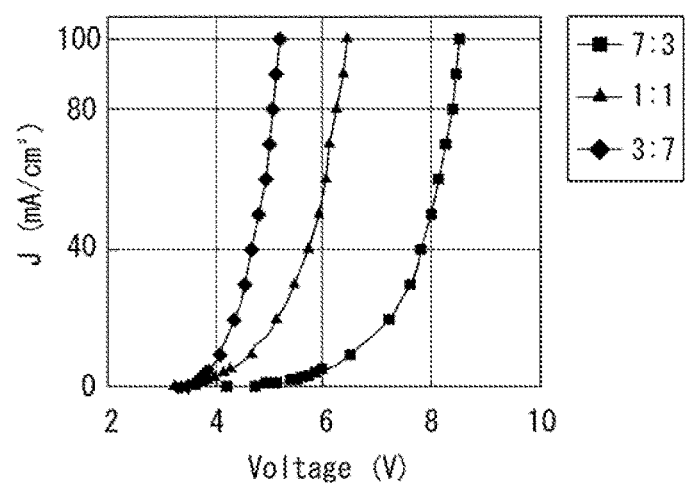
FIG. 10 is a graph of the current density vs. operating voltage of a device according to Embodiment 2 of the present invention.
Figure 11:
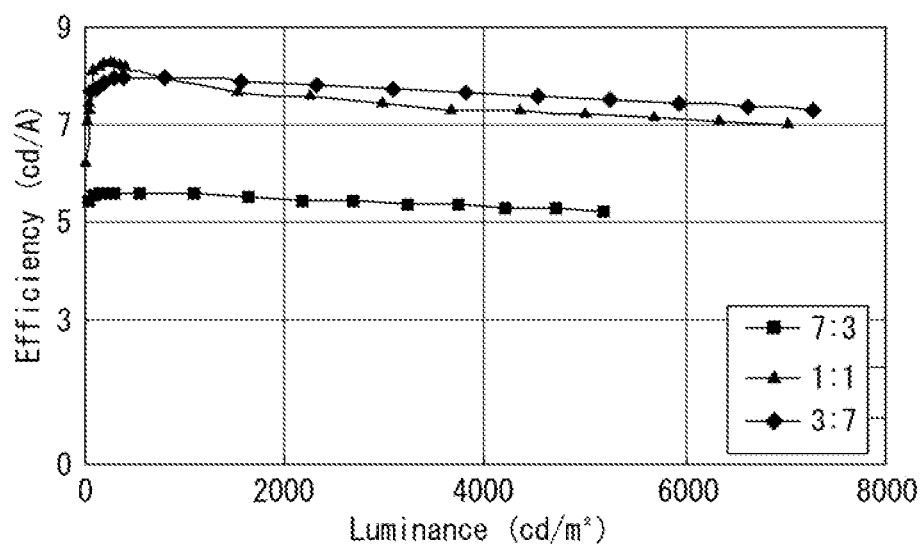
FIG. 11 is a graph of the efficiency vs. luminance of a device according to Embodiment 2 of the present invention.

Referring to FIGS. 10 and 11 and Table 3, both the mix ratios of 1:1 and 3:7 produced the same level of emission efficiency, and the mix ratio of 3:7 produced the lowest level of operating voltage. The mix ratio of 7:3 produced high operating voltage and low emission efficiency. From these results, it can be found out that, to manufacture a device with low voltage and high efficiency, the mix ratio of a material with high electron mobility to a material with a high triplet exciton energy level should be 1:1 or higher.

Figure 12:
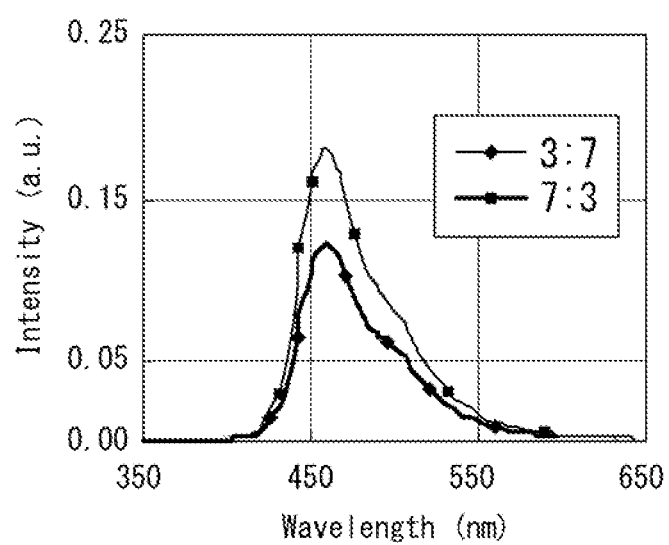
FIG. 12 is a graph showing the luminescence intensity vs. wavelength of devices using 7:3 and 3:7 mix ratios of materials in an electron transport layer according to Embodiment 2 of the present invention.
Figure 13:
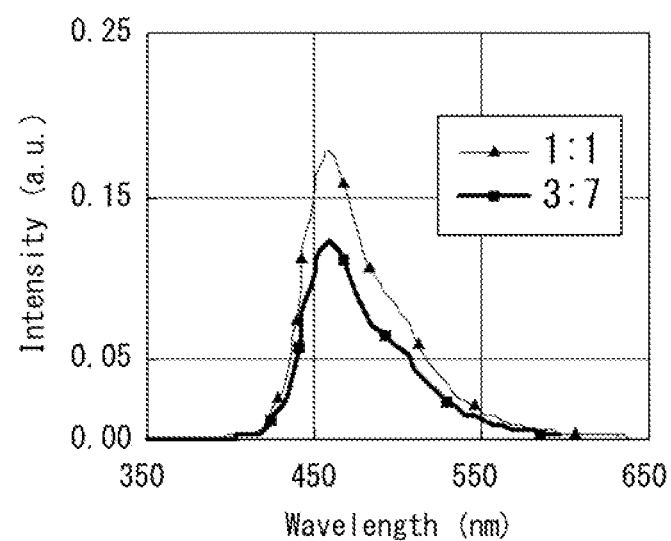
FIG. 13 is a graph showing the luminescence intensity vs. wavelength of devices using 1:1 and 3:7 mix ratios of materials in an electron transport layer according to Embodiment 2 of the present invention.

As illustrated in FIGS. 12 and 13, it can be seen that the mix ratio of 3:7 produced an increase in luminescence intensity at wavelengths of 440 to 480 nm for blue light emission, compared to the mix ratio of 7:3. Accordingly, it can be found out that an increase in luminescence intensity can be achieved when the electron transport layer has a higher ratio of the material with high electron mobility to the material with a high triplet exciton energy level.

Test 3: Characteristics of Device Depending on Thickness of Electron Transport Layer <Embodiment 3>

Organic light emitting display devices were manufactured by forming, on a substrate, a first light emitting part comprising a blue light emitting layer, a charge generation layer, a second light emitting part comprising a yellow light emitting layer, another charge generation layer, a third light emitting part having a blue light emitting layer, and a cathode. An electron transport layer in the third light emitting part was formed with a thickness of 25 nm by mixing an oxadiazole compound and a quinoline compound at a ratio of 3:2.

The materials for the electron transport layer of Embodiment 3 do not limit the scope of the present invention.

Organic light emitting display devices according to Embodiment 3 were manufactured using different thicknesses of 25 nm to 30 nm for the electron transport layer, and their operating voltage and emission efficiency were measured and shown in the following Table 4. The current density vs. operating voltage was measured and shown in FIG. 14, the efficiency vs. luminance was measured and shown in FIG. 15, and the luminescence intensity vs. wavelength was measured and shown in FIG. 16. In the following Table 4, the measurements taken from the device manufactured using the thickness of 25 nm for the electron transport layer were expressed as a percentage relative to those taken from the device manufactured using the thickness of 30 nm for the electron transport layer, corresponding to 100%.

TABLE 4

|  | Thickness (nm) of Electron Transport Layer | |
| --- | --- | --- |
|  | 25 | 30 |
| Operating Voltage | 94.3% | 100.0% |
| Emission Efficiency | 97.4% | 100.0% |

Figure 14:
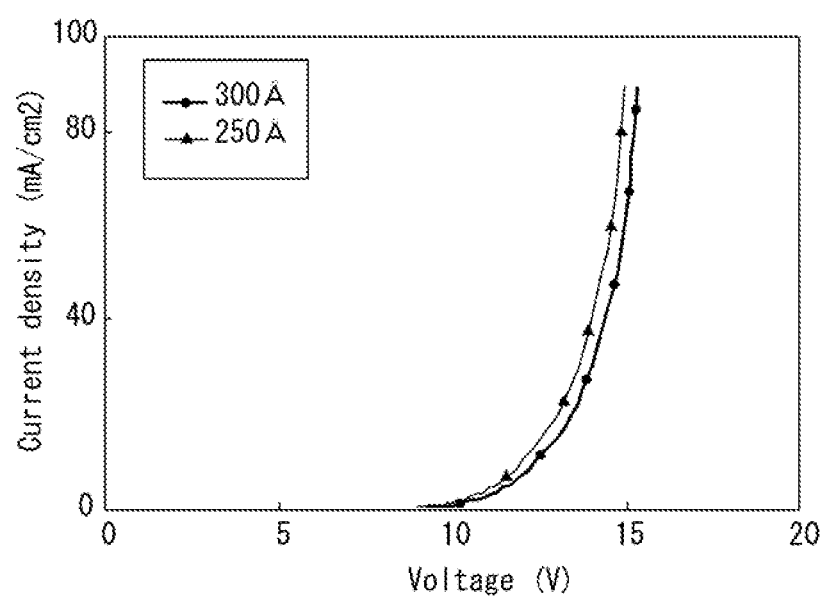
FIG. 14 is a graph showing the current density vs. operating voltage of an organic light emitting display device according to Embodiment 3 of the present invention.
Figure 15:
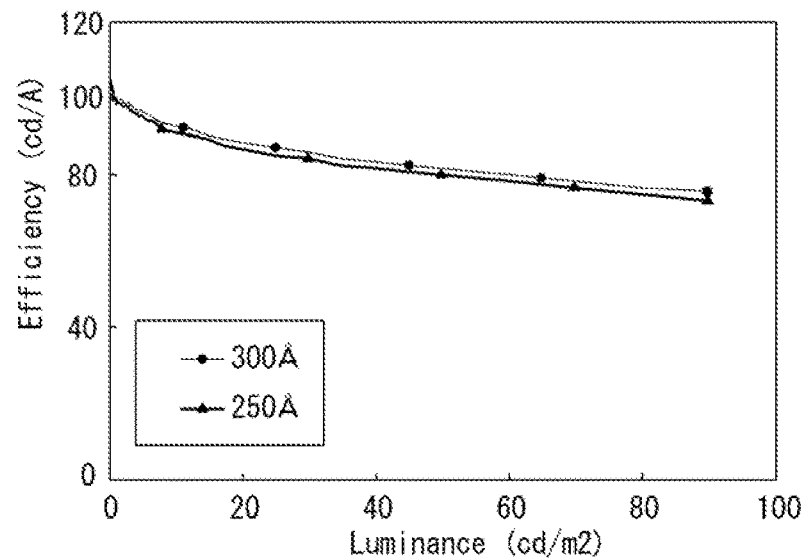
FIG. 15 is a graph showing the efficiency vs. luminance of an organic light emitting display device according to Embodiment 3 of the present invention.

Referring to FIGS. 14 and 15 and Table 4, as the thickness of the electron transport layer was reduced from 30 nm to 25 nm, the operating voltage was decreased and the emission efficiency was also decreased slightly. From these results, it can be found out that the reduction in the thickness of the electron transport layer is better in terms of operating voltage.

Figure 16:
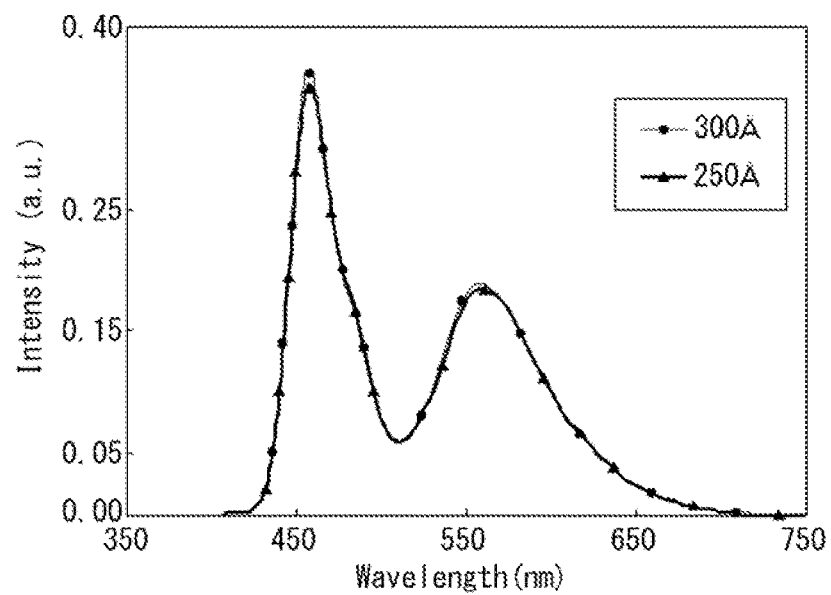
FIG. 16 is a graph showing the luminescence intensity vs. wavelength of an organic light emitting display device according to Embodiment 3 of the present invention.

As illustrated in FIG. 16, it can be seen that the thickness of 30 nm produced an increase in luminescence intensity at wavelengths of 440 to 480 nm for blue light emission and at wavelengths of 510 to 590 nm for yellow-green light emission, compared to the thickness of 25 nm.

Test 4: Characteristics of Organic Light Emitting Display Device with Depending on Mixed Material for Electron Transport Layer <Embodiment 4>

An organic light emitting display device having the same composition as Embodiment 3 was manufactured by using a mixture of an oxadiazole compound and a quinoline compound with a 1:1 ratio as the electron transport layer.

<Embodiment 5>

An organic light emitting display device having the same composition as Embodiment 4 was manufactured by using a mixture of a carbazole compound and a quinoline compound with a 1:1 ratio as the electron transport layer.

The materials for the electron transport layer used in Embodiments 4 and 5 do not limit the scope of the present invention.

The operating voltage, RGBW color lifetime, emission efficiency, and quantum efficiency of the devices manufactured according to Embodiments 4 and 5 were measured and shown in the following Table 5. Also, the current density vs. operating voltage was measured and shown in FIG. 17, the efficiency vs. luminance was measured and shown in FIG. 18, and the luminescence intensity vs. wavelength was measured and shown in FIG. 19. In the following Table 5, the measurements taken from Embodiment 5 were expressed as a percentage relative to those taken from Embodiment 4 corresponding to 100%.

TABLE 5

|  |  | Embodiment 4 | Embodiment 5 |
| --- | --- | --- | --- |
| Operating Voltage | Vpeak | 100% | 97.7% |
|  | V (10 mA/cm$^2$) | 100% | 98.3% |
| Lifetime (T95) | R | 100% | 101.6% |
|  | G | 100% | 98.7% |
|  | B | 100% | 72.5% |
|  | W | 100% | 94.0% |
| Properties | Emission Efficiency | 100% | 100.2% |
|  | Quantum Efficiency | 100% | 100.3% |

Figure 17:
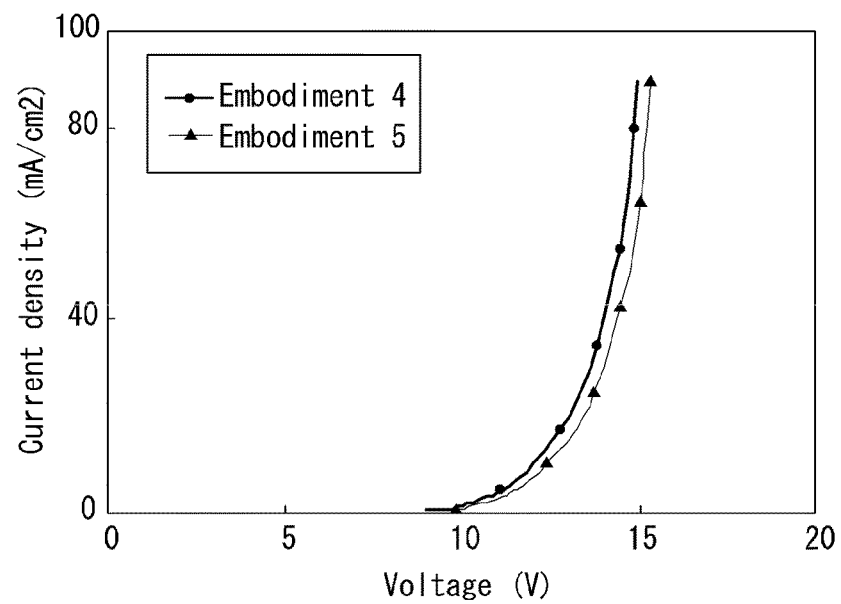
FIG. 17 is a graph showing the current density vs. operating voltage of organic light emitting display devices according to Embodiments 4 and 5 of the present invention.
Figure 18:
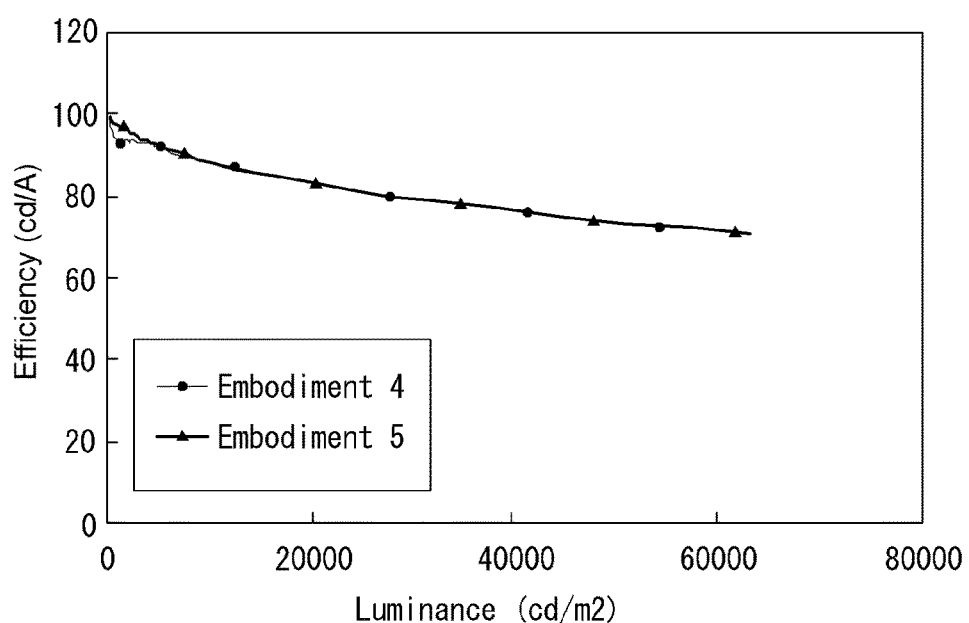
FIG. 18 is a graph showing the efficiency vs. luminance of organic light emitting display devices according to Embodiments 4 and 5 of the present invention.

Referring to FIGS. 17 and 18 and Table 5, the devices according to Embodiments 4 and 5 using materials with similar properties showed the same levels of lifetime and efficiency.

Figure 19:
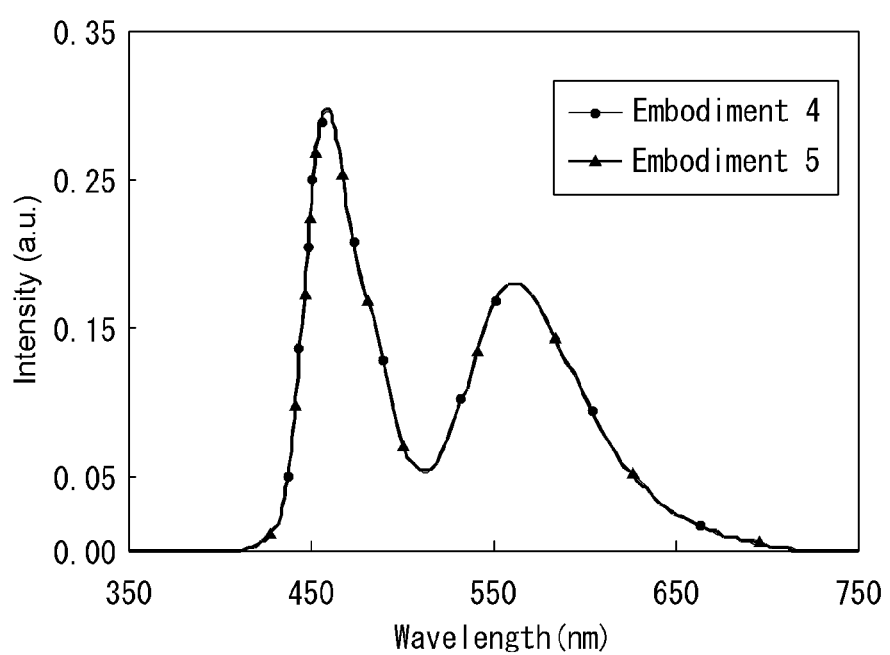
FIG. 19 is a graph showing the luminescence intensity vs. wavelength of organic light emitting display devices according to Embodiments 4 and 5 of the present invention.

As illustrated in FIG. 19, it can be seen that the devices showed the same level of luminescence intensity at wavelengths of 440 to 480 nm for blue light emission and at wavelengths of 510 to 590 nm for yellow-green light emission.

Test 5: Characteristics of Organic Light Emitting Display Device Depending on Thickness of Each Layer of Electron Transport Layer <Embodiment 6>

An organic light emitting display device having the same composition as Embodiment 2 was manufactured by using a mixture of an oxadiazole compound and a quinoline compound with a 1:1 ratio as the electron transport layer.

<Embodiment 7>

An organic light emitting display device having the same composition as Embodiment 6 was manufactured by using an oxadiazole compound with a thickness of 5 nm as a first layer of the electron transport layer, using a mixture of an oxadiazole compound and a quinoline compound with a 1:1 ratio and a thickness of 20 nm as a mixed layer of the electron transport layer, and using a quinoline compound with a thickness of 5 nm as a second layer of the electron transport layer.

<Embodiment 8>

An organic light emitting display device having the same composition as Embodiment 7 was manufactured by using an oxadiazole compound with a thickness of 10 nm as a first layer of the electron transport layer, using a mixture of an oxadiazole compound and a quinoline compound with a 1:1 ratio and a thickness of 10 nm as a mixed layer of the electron transport layer, and using a quinoline compound with a thickness of 10 nm as a second layer of the electron transport layer.

<Embodiment 9>

An organic light emitting display device having the same composition as Embodiment 7 was manufactured by using an oxadiazole compound with a thickness of 5 nm as a first layer of the electron transport layer, using a mixture of an oxadiazole compound and a quinoline compound with a 1:1 ratio and a thickness of 15 nm as a mixed layer of the electron transport layer, and using a quinoline compound with a thickness of 10 nm as a second layer of the electron transport layer.

<Embodiment 10>

An organic light emitting display device having the same composition as Embodiment 7 was manufactured by using an oxadiazole compound with a thickness of 10 nm as a first layer of the electron transport layer, using a mixture of an oxadiazole compound and a quinoline compound with a 1:1 ratio and a thickness of 15 nm as a mixed layer of the electron transport layer, and using a quinoline compound with a thickness of 5 nm as a second layer of the electron transport layer.

The operating voltage, emission efficiency, and lifetime of the devices manufactured according to Embodiments 6 to 10 were measured and shown in the following Table 6. In the following Table 6, the measurements taken from Embodiments 7 to 10 were expressed as a percentage relative to those taken from Embodiment 6 corresponding to 100%.

TABLE 6

|  | Embodiment 6 | Embodiment 7 | Embodiment 8 | Embodiment 9 | Embodiment 10 |
|---|---|---|---|---|---|
| Operating Voltage | 100% | 95% | 100% | 91% | 98% |
| Efficiency | 100% | 103% | 95% | 105% | 104% |
| Lifetime | 100% | 102% | 90% | 118% | 105% |

Referring to Table 6, Embodiment 7 using an electron transport layer comprising a first layer of 5 nm, a mixed layer of 20 nm, and a second layer of 5 nm showed a 5% decrease in operating voltage, a 3% increase in efficiency, and a 2% increase in lifetime, compared to Embodiment 6 using an electron transport layer formed of a single layer of 30 nm. Embodiment 8 using an electron transport layer comprising a first layer of 10 nm, a mixed layer of 10 nm, and a second layer of 10 nm showed the same level of operating voltage, a 5% decrease in efficiency, and a 10% decrease in lifetime. Embodiment 9 using an electron transport layer comprising a first layer of 5 nm, a mixed layer of 15 nm, and a second layer of 10 nm showed a 9% decrease in operating voltage, a 5% increase in efficiency, and an 18% increase in lifetime. Embodiment 10 using an electron transport layer comprising a first layer of 10 nm, a mixed layer of 15 nm, and a second layer of 5 nm showed a 2% decrease in operating voltage, a 4% increase in efficiency, and a 5% increase in lifetime.

All of these embodiments except Embodiment 8 showed a decrease in operating voltage compared to Embodiment 6, and Embodiments 7, 8, and 10 showed an increase in efficiency and lifetime, compared to Embodiment 6. From these results, it can be found out that a decrease in the efficiency and lifetime of the devices can be achieved if the mixed layer of the electron transport layer is 10 nm thickness or less, and a desirable thickness for the mixed layer of the electron transport layer is 15 nm or greater. Moreover, it can be concluded that Embodiment 9 showed the best results and hence the electron transport layer comprising the first layer of 5 nm, the mixed layer of 15 nm, and the second layer of 10 nm is most preferable.

As described above, the organic light emitting display device of the present invention offers the advantage of lowering the barrier for charges to move from adjacent layers and reducing the operating voltage by having an electron transport layer comprising a first electron transport material having a high triplet exciton energy level and a second electron transport material having high electron mobility. Moreover, the organic light emitting display device of the present invention can increase the device efficiency since the electron transport layer comprises a first layer comprising a first electron transport material having a high triplet exciton energy level, and facilitate electron transfer and reduce the operating voltage since the electron transport layer comprises a second layer comprising a second electron transport material having high electron mobility.

In addition, the operating voltage can be lowered by using a 1:1 or higher ratio of the second electron transport material with high electron mobility to the first electron transport material with a high triplet exciton energy level.

Although embodiments have been described with reference to a number of illustrative embodiments thereof, it should be understood that numerous other modifications and embodiments can be devised by those skilled in the art that will fall within the scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
at least one light emitting layer between an anode and a cathode; and
an electron transport layer between the at least one light emitting layer and the cathode, the electron transport layer including:
a first layer having a first electron transport material for blocking holes from the at least one light emitting layer to the electron transport layer;
a second layer having a second electron transport material for assisting in a transfer of electrons to the at least one light emitting layer; and
a mixed layer having the first electron transport material and the second electron transport material,
wherein the first electron transport material and the second electron transport material have different triplet exciton energy levels and different electron mobilities.

2. The organic light emitting display device of claim 1, wherein the triplet exciton energy level of the first electron transport material is higher than that of the second electron transport material.

3. The organic light emitting display device of claim 1, wherein the electron mobility of the first electron transport material is lower than that of the second electron transport material.

4. The organic light emitting display device of claim 1, wherein the triplet exciton energy level of the first electron transport material is within a range of 2.6 eV to 2.8 eV, and the triplet exciton energy level of the second electron transport material is within a range of 1.6 eV to 2.0 eV.

5. The organic light emitting display device of claim 1, wherein the electron mobility of the second electron transport material is within a range of $1 \times 10^{-3}$ cm$^2$/Vs to $1 \times 10^{-5}$ cm$^2$/Vs.

6. The organic light emitting display device of claim 1, wherein the first electron transport material includes 30 to 50% of the sum of the first and second electron transport materials.

7. The organic light emitting display device of claim 1, wherein a ratio of the first electron transport material is equal to or lower than a ratio of the second electron transport material.

8. The organic light emitting display device of claim 1, wherein a thickness of the electron transport layer is within a range of 5 to 45nm.

9. The organic light emitting display device of claim 1, wherein thicknesses of the first and second layers include 25% to 100% of a thickness of the mixed layer, and the thickness of the mixed layer is within a range of 15 to 20 nm.

10. The organic light emitting display device of claim 1, wherein the first electron transport material is adjacent to the at least one light emitting layer, and is configured to block holes passing from the at least one light emitting layer to the electron transport layer.

11. The organic light emitting display device of claim 1, wherein the second electron transport material is adjacent to the cathode, and is configured to assist in the transfer of electrons to the at least one light emitting layer.

12. The organic light emitting display device of claim 1, wherein a charge balance in the light emitting layer is adjusted using the first electron transport material and the second electron transport material.

13. An organic light emitting display device comprising:
   at least one light emitting part between an anode and a cathode; and
   an electron transport layer between the at least one light emitting part and the cathode,
   wherein the electron transport layer is composed of at least one layer, and
   wherein the at least one layer includes:
      a first layer including a first electron transport material,
      a second layer including a second electron transport material, and
      a mixed layer including the first electron transport material and the second electron transport material.

14. The organic light emitting display device of claim 13, wherein the first and second electron transport materials have different triplet exciton energy levels or different electron mobilities.

15. The organic light emitting display device of claim 14, wherein the triplet exciton energy level of the first electron transport material is higher than that of the second electron transport material.

16. The organic light emitting display device of claim 15, wherein the triplet exciton energy level of the first electron transport material is within a range of 2.6 eV to 2.8 eV, and the triplet exciton energy level of the second electron transport material is within a range of 1.6 eV to 2.0 eV.

17. The organic light emitting display device of claim 14, wherein the electron mobility of the first electron transport material is lower than that of the second electron transport material.

18. The organic light emitting display device of claim 17, wherein the electron mobility of the second electron transport material is within a range of $1\times10^{-3}$ cm$^2$/Vs to $1\times10^{-5}$ cm$^2$/Vs.

19. The organic light emitting display device of claim 13, wherein the first electron transport material includes 30 to 50% of the sum of the first and second electron transport materials.

20. The organic light emitting display device of claim 13, wherein a ratio of the first electron transport material is equal to or lower than a ratio of the second electron transport material.

21. The organic light emitting display device of claim 13, wherein a thickness of the electron transport layer is within a range of 5 to 45 nm.

22. The organic light emitting display device of claim 21, wherein thicknesses of the first and second layers include 25% to 100% of a thickness of the mixed layer, and the thickness of the mixed layer is within a range of 15 to 20 nm.

* * * * *